(12) United States Patent
Chiba et al.

(10) Patent No.: US 7,800,311 B2
(45) Date of Patent: Sep. 21, 2010

(54) POWER SUPPLY UNIT, HIGH-FREQUENCY CIRCUIT SYSTEM AND HEATER VOLTAGE CONTROL METHOD

(75) Inventors: Akira Chiba, Sagamihara (JP); Yukihira Nakazato, Sagamihara (JP)

(73) Assignee: Netcomsec Co. Ltd., Tokyo (JP)

( * ) Notice: Subject to any disclaimer, the term of this patent is extended or adjusted under 35 U.S.C. 154(b) by 325 days.

(21) Appl. No.: 12/050,609

(22) Filed: Mar. 18, 2008

(65) Prior Publication Data
US 2008/0231197 A1 Sep. 25, 2008

(30) Foreign Application Priority Data
Mar. 19, 2007 (JP) ............................. 2007-070519

(51) Int. Cl.
H05B 39/04 (2006.01)
(52) U.S. Cl. .................. 315/106; 315/107; 315/276; 315/307
(58) Field of Classification Search .................. 315/94, 315/106–107, 115–116, 224–225, 276, 291, 315/294, 297, 307–309
See application file for complete search history.

(56) References Cited

U.S. PATENT DOCUMENTS 4,894,587 A * 1/1990 Jungreis et al. ......... 315/200 R
5,449,979 A * 9/1995 Ueoka et al. .............. 315/225
6,753,651 B1 * 6/2004 Goral ......................... 315/86
2007/0273304 A1 * 11/2007 Greenwood et al. ......... 315/307

FOREIGN PATENT DOCUMENTS
JP 06-310045 A 11/1994

* cited by examiner

*Primary Examiner*—Douglas W Owens
*Assistant Examiner*—Tung X Le
(74) *Attorney, Agent, or Firm*—Sughrue Mion, PLLC (57) ABSTRACT

At the time of restoration of the power supply after a power failure, a voltage higher than that in the normal operation mode is supplied to a heater. After a lapse of a predetermined time, the voltage to be supplied to the heater is switched into the voltage in the normal operation mode while a control signal for stating the operation of an electron tube is output. Alternatively, at the time of power activation, the rate of change of current flowing through a heater is determined for every period of time. When the rate of change becomes equal to or lower than a predetermined threshold, a voltage higher than that in the normal operation mode is supplied to the heater, and after a lapse of a predetermined time, the voltage to be supplied to the heater is switched into the voltage in the normal operation mode while a control signal for stating the operation of the electron tube is output.

14 Claims, 11 Drawing Sheets

Fig.1

RELATED ART

Fig. 2

RELATED ART

POWER SUPPLY UNIT, HIGH-FREQUENCY CIRCUIT SYSTEM AND HEATER VOLTAGE CONTROL METHOD

This application is based upon and claims the benefit of priority from Japanese patent application No. 2007-070519, filed on Mar. 19, 2007, the disclosure of which is incorporated herein in its entirety by reference.

BACKGROUND OF THE INVENTION

1. Field of the Invention

The present invention relates to a power supply unit, high-frequency circuit system and heater voltage control method, preferable for supplying heater voltage to an electron tube.

2. Description of the Related Art

Traveling-wave tubes, electron guns and the like are electron tubes for use in performing amplification, oscillation etc. of high-frequency signals by an interaction process between a beam of electrons emitted from an electron gun and a high-frequency circuit.

Figure 1:
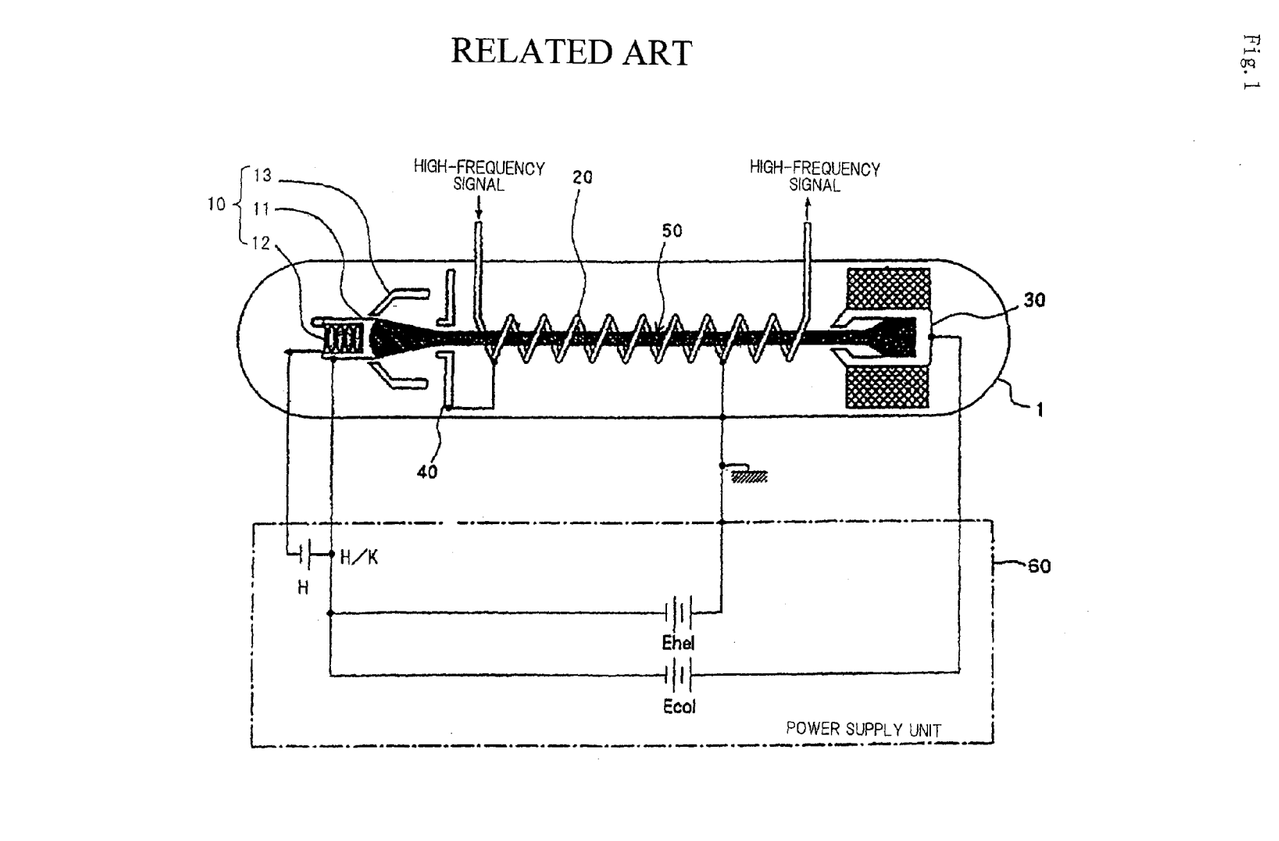
FIG. 1 is a block diagram showing an example of a high-frequency circuit system of the background art.

FIG. 1 is an example of a high-frequency circuit system of a background art.

As shown in FIG. 1, traveling-wave tube 1 includes, for example, electron gun 10 for emitting a beam of electrons, helix 20 as a high-frequency circuit for causing an interaction between electron beam 50 emitted from electron gun 10 and a high-frequency signal (microwave), collector electrode 30 for capturing electron beam 50 traveling inside helix 20 and anode electrode 40 for extracting electrons from electron gun 10 and leading electron beam 50 emitted from electron gun 10 into helix 20.

Electron gun 10 includes cathode electrode 11 for emitting electrons, Wehnelt electrode 13 for converging the electrons emitted from cathode electrode 11 and heater 12 for supplying thermal energy for causing emission of thermal electrons from cathode electrode 11.

Electron beam 50 emitted from electron gun 10 is accelerated by the potential difference between cathode electrode 11 and helix 20 and lead into helix 20 so that it travels therethrough while interacting with a high-frequency signal input to helix 20. The electron beam propagating inside helix 20 is captured by collector electrode 30. As a result of this process, a high-frequency signal that has been amplified by interaction with electron beam 50 is output from helix 20.

As shown in FIG. 1, a negative DC voltage based on the potential of helix 20 is supplied as helix voltage EheI to cathode electrode 11 while a positive DC voltage based on the H/K potential of cathode electrode 11 is supplied as collector voltage EcoI to collector electrode 30. A negative DC voltage based on the H/K potential of cathode electrode 11 is supplied as heater voltage H to heater 12.

Helix 20 is grounded by connection to the case of traveling-wave tube 1. Anode electrode 40 is connected to, for example helix 20 so that it is set at the same potential as helix 20. In some cases, traveling-wave tube 1 may take a configuration in which anode electrode 40 is not connected to helix 20. In this case, a positive DC voltage based on the H/K potential of cathode 11 is supplied as anode voltage Ea to anode electrode 40.

Helix voltage EheI, collector voltage EcoI, anode voltage Ea and heater voltage H are generated using for example, inverters, which are well known to covert a DC voltage to an AC voltage, transformers, rectifying circuits and capacitors for rectification and the like. FIG. 1 shows a configurational example of traveling-wave tube 1 including a single collector electrode 30. However, traveling-wave tube 1 may include two collector electrodes or three or more collector electrodes.

In a case where the thus constructed traveling-wave tube 1 is operated, it is necessary to supply heater voltage H first to pre-heat cathode electrode 11 (about 3 to 5 minutes) and then supply helix voltage EheI, anode voltage Ea and collector voltage EcoI after completion of preheating. Accordingly, there are many cases in the power supply unit for traveling-wave tube 1, in which the heater power supply circuit for generating heater voltage H is provided independently from the high-voltage power supply circuit, for generating helix voltage EheI, anode voltage Ea and collector voltage EcoI.

Figure 2:
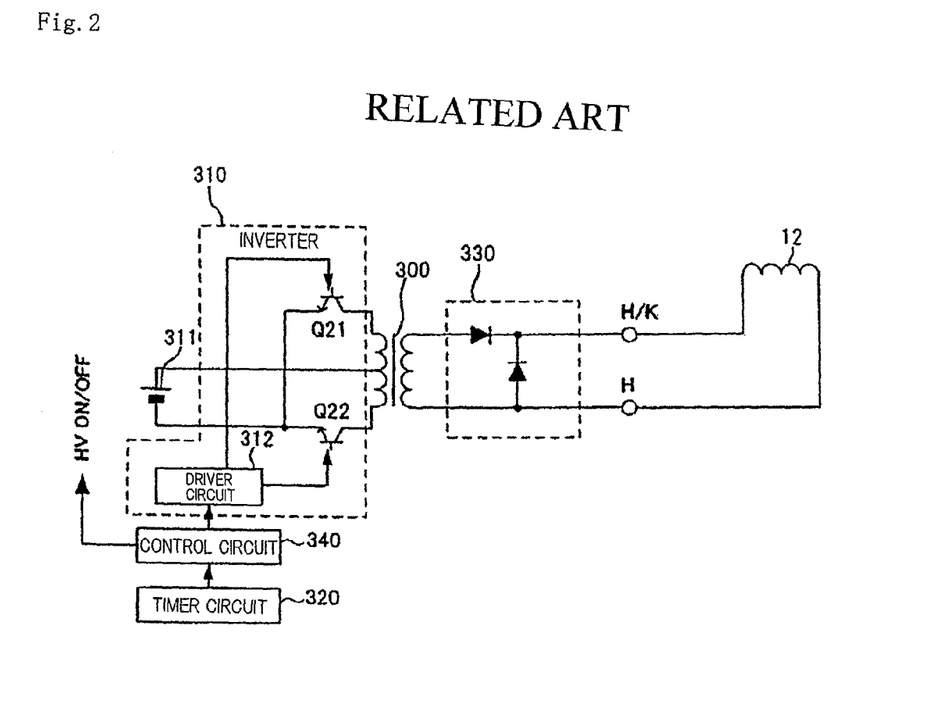
FIG. 2 is a block diagram showing a power supply unit configuration of a background art for supplying heater voltage shown in FIG. 1.

FIG. 2 shows a configuration of a power supply unit in the background art for supplying the heater voltage shown in FIG. 1.

As shown in FIG. 2, the power supply unit of the background art includes transformer 300, DC voltage source 311, inverter 310 for converting the DC is voltage output from DC voltage source 311 into an AC voltage to be supplied to the primary coil of transformer 300, rectifying circuit 330 for rectifying the AC voltage output from the secondary coil of transformer 300 to supply a DC voltage to heater 12, timer circuit 320 to be used for measurement of preheating time, and control circuit 340 that controls the operation of inverter 310 and outputs an HV ON/OFF signal as a control signal for enabling the output of helix voltage EheI, anode voltage Ea and collector voltage EcoI after a lapse of a predetermined preheating time set up at the time that power is activated based on timer circuit 320.

Inverter 310 includes transistors Q21 and Q22 for converting the DC voltage output from DC voltage source 311 into an AC voltage and driver circuit 312 for turning on and off transistors Q21 and Q22 alternately.

Rectifying circuit 330 includes a full-wave rectifying circuit made of two diodes, for example and rectifies the AC voltage output from the secondary coil of transformer 300 to output as heater voltage H a negative DC voltage based on the H/K potential of cathode electrode 11 (not shown).

In the configuration for controlling the preheating time by control circuit 340 based on timer circuit 320 shown in FIG. 2, usually, the preheating time is set at a sufficiently large value so that the temperature of cathode electrode 11, not illustrated, rises high enough and traveling-wave tube 1 operates stably. For this reason, the preheating time tends to be longer than needed, hence it takes a long time from the activation of the power supply until operation of traveling-wave tube 1 starts.

As a method of shortening the preheating time, there is a configuration disclosed in Japanese Patent Application Laid-open No. 06-310045 in which heater voltage H is set higher than normal voltage at the time of power activation and then heater voltage H is changed to normal voltage when a temperature sensor detects that cathode electrode 11 has reached a predetermined temperature.

Now, a case will be considered where a power failure occurred in the DC voltage source during normal operation in the power supply unit of the background art shown in FIG. 2.

In the power supply unit of the background art, if a power failure occurred in the DC voltage source during normal operation and recovers from the power failure, the timing for sending out an HV ON/OFF signal is also controlled by the control circuit.

For restoration of the power supply after a power failure, the power supply unit of the background art usually adopts either the method of sending out an HV ON/OFF signal after a lapse of the predetermined preheating time in the same manner as is done at the time of power activation or one of the methods of changing the preheating time in accordance with the time (power failure time) at which the power has been cut off. As the method of changing the preheating time in accordance with the power failure time, it is typical to set the preheating time to be equal to the time of power failure. In this case, however, the maximum of the preheating time is as long as about 3 to 5 minutes, which is the preheating time at the time of power activation.

However, according to the method of sending out an HV ON/OFF signal after a lapse of the predetermined preheating time, in order to heat cathode electrode 11 to a high enough temperature, a preheating time that is as long as about 3 to 5 minutes, as stated above, is secured even if a so-called instantaneous power failure of some seconds has occurred. Accordingly, this method entails the problem that the time for restarting the operation of the traveling-wave tube becomes wastefully long.

Figure 3:
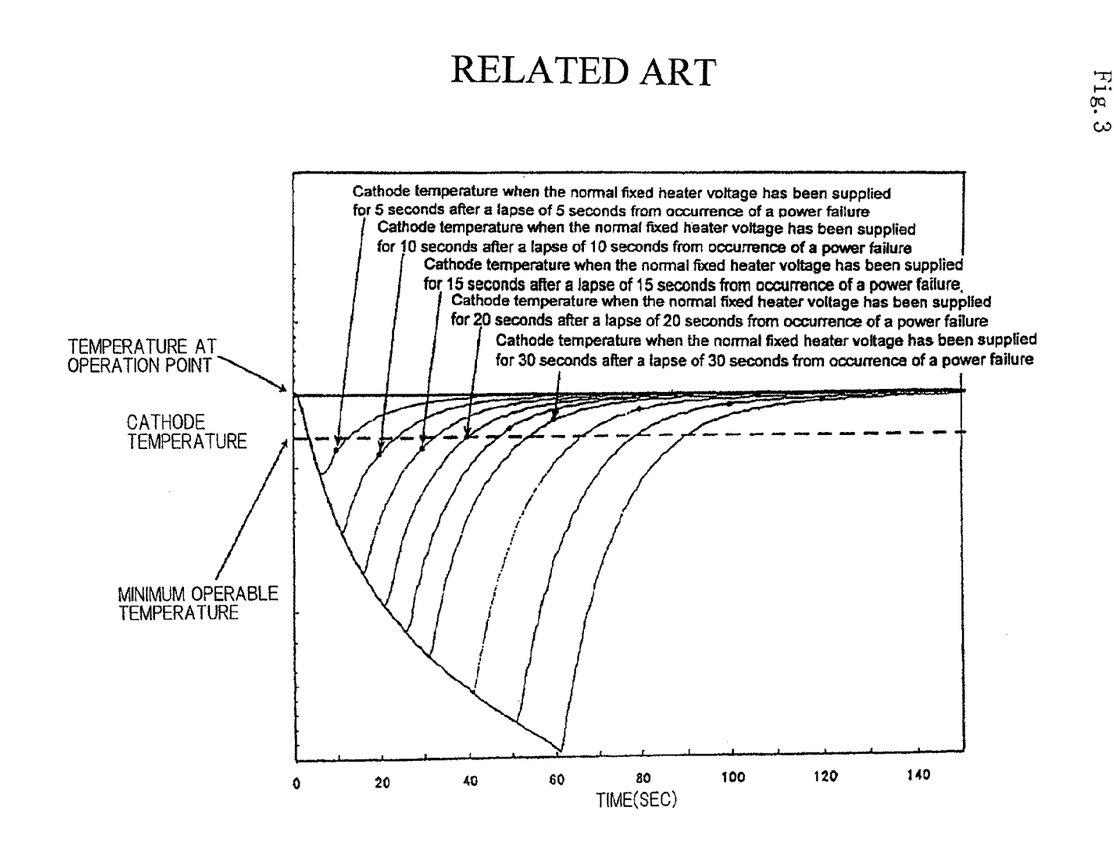
FIG. 3 is a graph showing one example of temperature variations of the cathode electrode when a traveling-wave tube is restored to operational status from instantaneous power failures.

On the other hand, according to the method of setting the preheating time to be as long as the time of the power failure, an effective way is to make the length of the power failure longer than a certain period (longer than 25 seconds in the example shown in FIG. 3) as shown in the graph of FIG. 3, for example. However, when the period of power failure is short (instantaneous), it may happen that the temperature of the cathode electrode cannot reach the operable temperature. This problem is attributed to the fact that since there are the parts that support the cathode electrode and the parts that are arranged close to the cathode electrode, it takes time for the cathode electrode and these parts to reach a state of thermal equilibrium. If the traveling-wave tube is operated by supplying helix voltage EheI, anode voltage Ea and collector voltage EcoI in a state in which the temperature of the cathode electrode has not been elevated high enough, the operation of the traveling-wave tube becomes unstable. FIG. 3 shows how the temperature of the cathode electrode behaves when all the power supply voltages of the traveling-wave tube are turned OFF from normal operation and the state afterwards in which the fixed voltage for normal operation has been applied to the heater for a period of time which is as long as the time in which the power supply voltages have been in an OFF condition. Further, in FIG. 3 the temperature characteristics of the cathode electrode, when supplying power voltages is halted at timings of 5, 10, 15, 20, 25, 30, 40, 50 and 60 seconds, are depicted in the order from the left. As shown in the graph of FIG. 3, it is understood that when the power failure time is relatively short such as 5 seconds, 10 seconds, 15 seconds etc., the temperature of the cathode electrode can not reach the minimum operable temperature when the duration for preheating the cathode electrode is equal to the duration of the power failure.

SUMMARY OF THE INVENTION

It is therefore an object of the present invention to provide a power supply unit, high-frequency circuit system and heater voltage control method that is capable of shortening the preheating period that is needed for a heater when the power supply is restored after a power failure or at the time that power is activated, without causing any operational instability.

In order to achieve the above object, in the present invention, at the time that the power supply units are restored to operational status, a voltage higher than that in the normal operation mode of an electron tube is supplied to the heater. This configuration makes it possible to raise the temperature of the cathode electrode faster than the background technique. That is, it is possible to make the temperature of the cathode electrode reach the operable temperature of the traveling-wave tube even when the duration of the power failure is short and the duration of the preheating time is set equal the duration of the power failure. As a result, it is possible to shorten the preheating time at the time of restoration from a power failure and make the traveling-wave tube's operation stable after restoration.

Further, in the present invention, it is determined at the time of power activation whether the rate of change of the current in the heater is equal to or lower than a predetermined threshold. This configuration makes it possible to determine whether the heater reaches the designated temperature. It is thus possible to shorten the preheating time at the time of power activation compared to the background art when a control signal for starting the operation of the electron tube is output at the stage when the heater has reached the designated temperature.

As a result, it is possible to shorten the preheating period that is needed for a heater at the time when the power supply unit is restored to operational status after a power failure or at the time that the power is activated in the power supply unit, without causing any operation instability.

The above and other objects, features, and advantages of the present invention will become apparent from the following description with reference to the accompanying drawings, which illustrate examples of the present invention.

DETAILED DESCRIPTION OF THE PREFERRED EMBODIMENT

Next, the present invention will be described with reference to the drawings.

Description hereinbelow will be made taking an example of a traveling-wave tube as an electron tube to be supplied with a heater voltage from a power supply unit of the present invention. However, the target to be supplied with a heater voltage from the power supply unit of the present invention should not be limited to traveling-wave tubes, but any other electron tubes such as klystrons, cathode-ray tubes and the like may be the target as long as they include a heater for supplying thermal energy for emitting electrons from a cathode electrode and starts its operation after preheating the heater is completed.

The First Exemplary Embodiment

FIG. 1 is a circuit diagram showing a configuration of the first exemplary embodiment of a power supply unit of the present invention. FIG. 5A is a waveform chart showing a voltage waveform and a current waveform in the power supply unit shown in FIG. 4 in normal operation mode after power is activated and FIG. 5B is a waveform chart showing a waveform and a current waveform in the power supply unit shown in FIG. 4 during restoration to operational status from a power failure. The power supply unit shown in FIG. 4 only includes a configuration of a heater power supply circuit for generating heater voltage H, but the power supply unit may include high-voltage power supply circuits for generating helix voltage Ehel, anode voltage Ea and collector voltage Ecol, Heater voltage H and heater current I shown in FIGS. 5A and 5B are shown by schematically illustrating how the voltage and current behave without specifying exact measurements.

Figure 4:
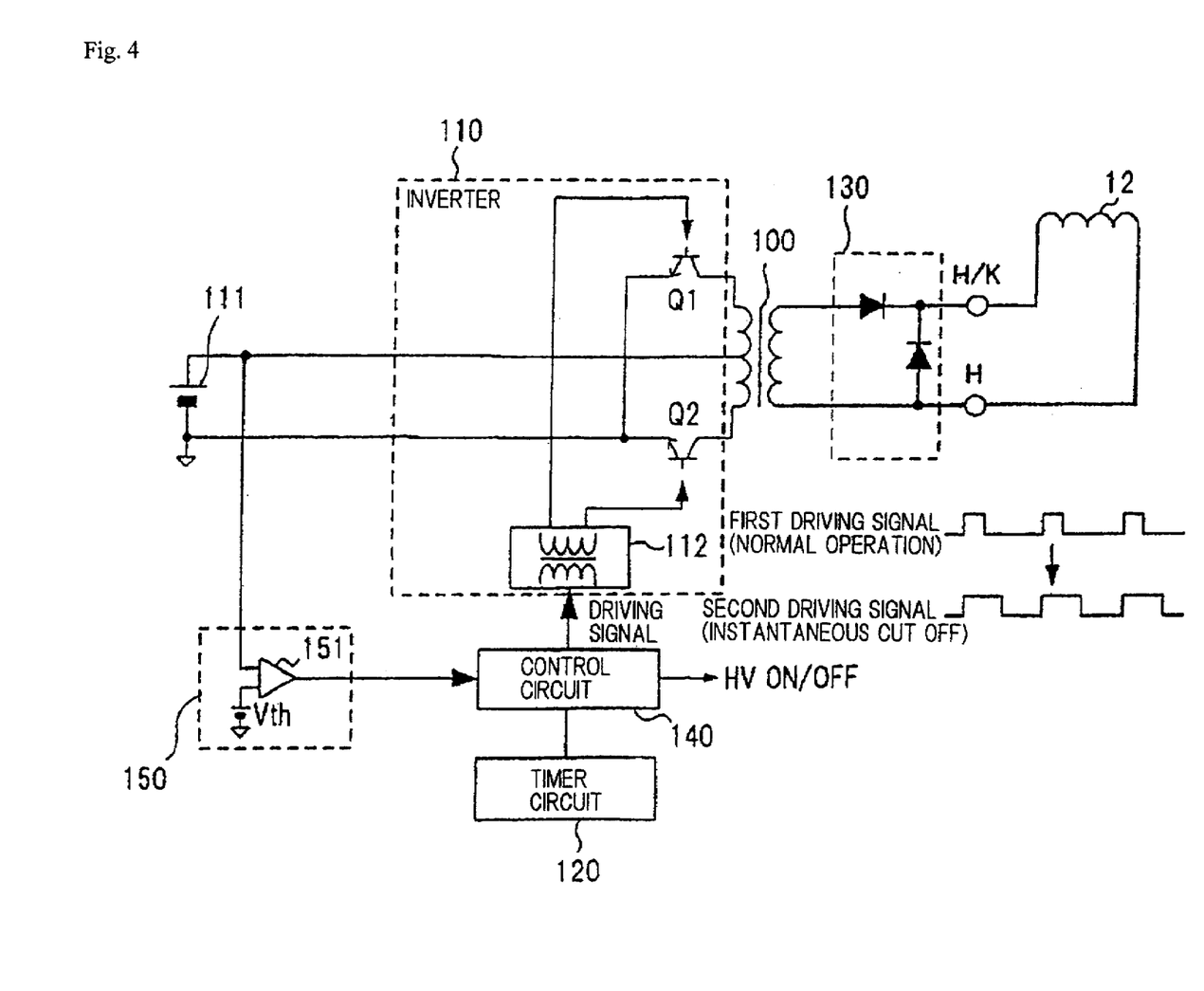
FIG. 4 is a circuit diagram showing a configuration of the first exemplary embodiment of a power supply unit of the present invention.
Figure 5A:
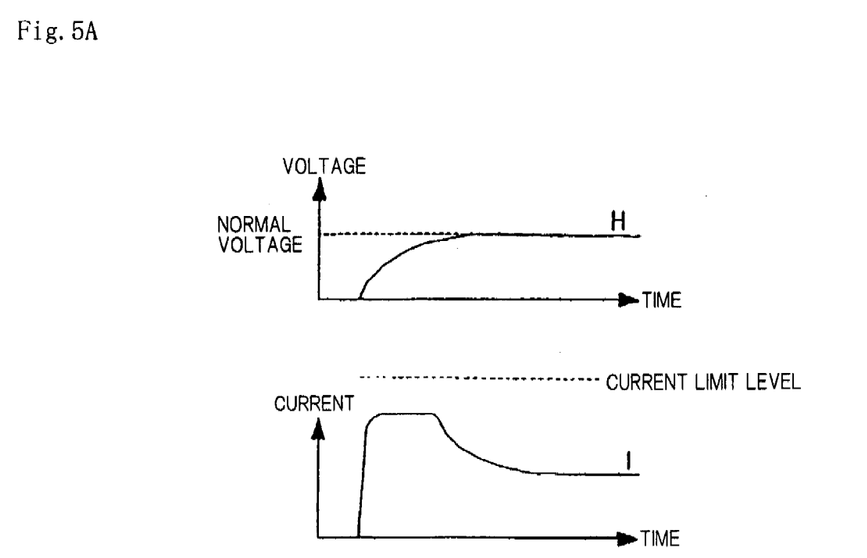
FIG. 5A is a waveform chart showing a voltage waveform and current waveform in the power supply unit shown in FIG. 4 in the normal operation mode after power has been activated.
Figure 5B:
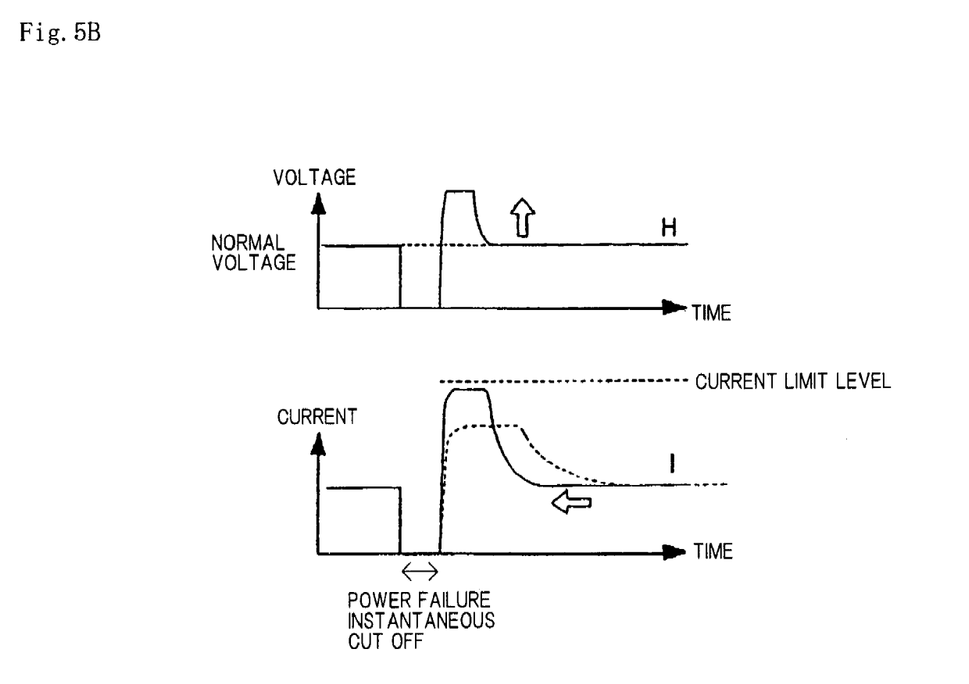
FIG. 5B is a waveform chart showing a waveform and current waveform in the power supply unit shown in FIG. 4 during restoration of the power supply after a power failure.

As shown in FIG. 4, the power supply unit of the first exemplary embodiment includes transformer 100, DC voltage source 111, inverter 110 for converting a DC voltage output from DC voltage source 111 into an AC voltage to be supplied to the primary coil of transformer 100, timer circuit 120, rectifying circuit 130 for rectifying the AC voltage output from the secondary coil of transformer 100 and supplying it to heater 12, control circuit 140 that controls the operation of inverter 110 and outputs an HV ON/OFF signal as a control signal for enabling the output of helix voltage Ehel, anode voltage Ea and collector voltage Ecol output, and power failure detecting circuit 150 for detecting a power failure.

Inverter 110 includes transistors Q1 and Q2 for converting the DC voltage output from DC voltage source 111 into an AC voltage and driver circuit 112 for alternately turning on and off transistors Q1 and Q2.

Power failure detecting circuit 150 includes comparator 151, and compares the output voltage from DC voltage source 111 with predetermined threshold voltage Vth and outputs the result of the comparison to control circuit 140 to thereby give a notice of either detection or non-detection of a power failure.

Rectifying circuit 130 includes a full-wave rectifying circuit made of two diodes, for example, and rectifies the AC voltage output from the secondary coil of transformer 100 to output as heater voltage H a negative DC voltage based on the H/K potential of cathode electrode 11.

Control circuit 140 can be embodied by an LSI including logical circuits and memory or a processor (computer) including a CPU and a recording medium having a program for realizing the process to be executed by the CPU. When the control circuit is embodied by a processor, the function of control circuit 140 described hereinbelow can be realized by a CPU that executes the process in accordance with the program stored in the recording medium.

Though FIG. 4 shows a configuration in which timer circuit 120 is provided independently, the timer circuit is not needed if control circuit 140 has a timer function.

When the power supply unit of the first exemplary embodiment is activated during normal operation, heater voltage H is boosted using a predetermined time constant, and then is controlled to be kept at a predetermined fixed level (normal voltage) as shown in FIG. 5A. Since heater 12 has a characteristic in which its resistance becomes greater as the temperature increases, current I passing through heater 12 takes a maximum value immediately after the power is activated, and then current I gradually decreases as the resistance increases.

Also, in the power supply unit of the first exemplary embodiment, when the power supply is restored after a power failure, heater voltage H is set at a level higher than the normal voltage and then is changed to the fixed level or the normal voltage as shown in FIG. 5B. Here, heater voltage H immediately after restoration of the power supply after a power failure is set so that the maximum value of heater current I is equal to or lower than a predetermined current limit level, taking into account the stress on heater 12 and cathode electrode 11. Supplying voltage H, at a voltage that is higher than the normal voltage, to heater 12 at the time that the power supply is restored after power failure in the above way enables the temperature of cathode electrode 11 to rise faster than that in the case of the background art. Accordingly, it is possible to make cathode electrode 11 reach the operable temperature even if the duration of power failure is short, and the duration of the preheating time is set to equal the duration of power failure. In this case, it is also possible to further shorten the preheating time by setting heater voltage H right after restoration to be higher as long as it does not create a problem of causing stress to heater 12 and/or cathode electrode 11.

Heater voltage H can be controlled by switching the pulse width of the driving signal to be supplied from control circuit 140 to driver circuit 112 as shown in FIG. 4. Specifically, in the normal operation mode, a first driving signal having a relatively narrow pulse width is supplied to transistors Q1 and Q2 from control circuit 140 by way of drive circuit 112. At the time that the power supply is restored after a power failure (instantaneous cutoff), a second driving signal having a pulse width wider than that of the normal operation is supplied to transistors Q1 and Q2 from control circuit 140 by way of drive circuit 112. In this case, heater voltage H takes a value proportional to the pulse width while transistors Q1 and Q2 are on. That is, heater voltage H driven by the second driving signal is higher than heater voltage H driven by the first driving signal.

Figure 6:
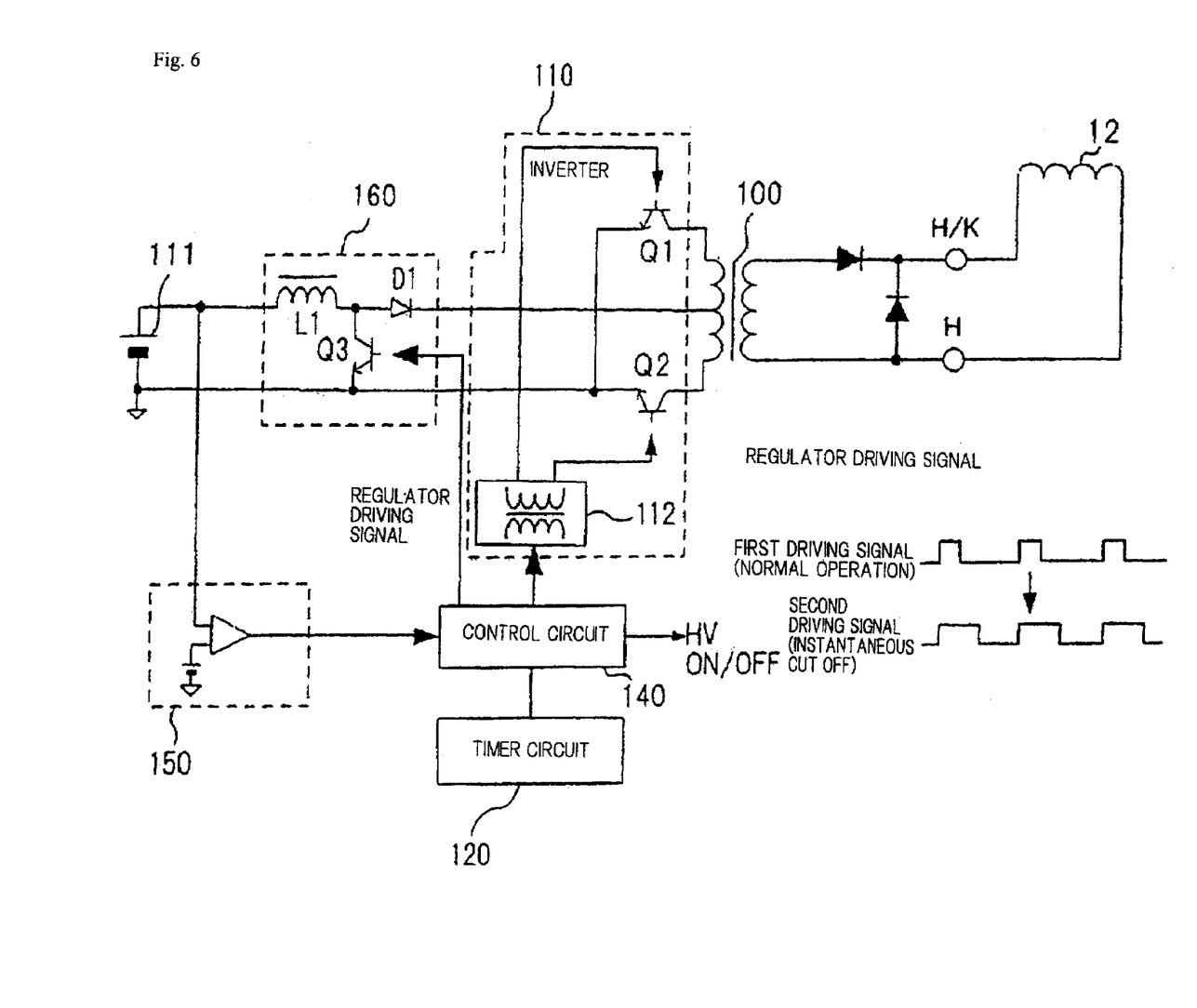
FIG. 6 is a circuit diagram showing another configurational example the first exemplary embodiment of a power supply unit of the present invention.

Alternatively, heater voltage H may be controlled by providing regulator circuit 160 between DC voltage source 111 and the primary coil of transformer 100 and by supplying a regulator driving signal from control circuit 140 to regulator circuit 160, as shown in FIG. 6.

Regulator circuit 160 shown in FIG. 6 is a boost type circuit for boosting the DC voltage output from DC voltage source 111, and includes inductance L1 and diode D1 which are connected in series between the output terminal of DC voltage source 111 and the center tap of the primary coil of transformer 100 and includes a transistor Q3 connected in parallel with DC voltage source 111. In regulator circuit 160 shown in FIG. 6, energy is accumulated in inductance L1 while transistor Q3 is on, whereas the energy accumulated in inductance L1 is supplied to inverter 110 via diode D1 while transistor Q3 is off. In this configuration, the boosted voltage can be controlled by the pulse width of the driving signal supplied to the base of transistor Q3, hence it is possible to supply a boosted voltage proportional to the pulse width to inverter 110.

When regulator circuit 160 shown in FIG. 6 is arranged between DC voltage source 111 and the primary coil of transformer 100, during normal operation the first driving signal having a relatively narrow pulse width is supplied from control circuit 140 to transistor Q3 of regulator circuit 160. On the other hand, at the time that the power supply is restored after a power failure (instantaneous cutoff), the second driving signal having a pulse width wider than that in the normal operation mode is supplied from control circuit 140 to transistor Q3 of regulator circuit 160. In this case, heater voltage H takes a value proportional to the pulse width while transistor Q3 is on. That is, heater voltage H driven by the second driving signal is higher than heater voltage H driven by the first driving signal.

When heater voltage H is controlled by using regulator circuit 160 shown in FIG. 6, a driving signal having a fixed pulse width may and should be supplied to inverter 110. Here, the driving signal supplied to regulator circuit 160 and the driving signal supplied to inverter 110 may or may not be synchronized with each other. However, if the driving signal supplied to regulator circuit 160 is synchronized with the driving signal supplied to inverter 110, the frequency components of the driving signal leaking toward the secondary coil of transformer 100 decrease, so that noise components contained in heater voltage H can be reduced.

Here, as regulator circuit 160, a well-known buck-boost type circuit may also be used to perform control instead of the boost type circuit shown in FIG. 6. When buck-boost type circuit is used, in the normal operation mode, a driving signal having a relatively wide pulse width is supplied from control circuit 140 to regulator circuit 160, at the time that the power supply is restored after a power failure (instantaneous cutoff) a driving signal having a pulse width narrower than that in the normal operation mode is supplied from control circuit 140 to regulator circuit 160, whereby it is possible to set heater voltage H to be higher than the normal voltage.

Regulator circuit 160 may be used any type of well-known circuits if the pulse width of the driving signal supplied from control circuit 140 is set up appropriately in accordance with the input/output characteristics.

Next, the operation for restoration of the power supply units shown in FIGS. 4 and 6 from a power failure will be described with reference to FIG. 7.

Figure 7:
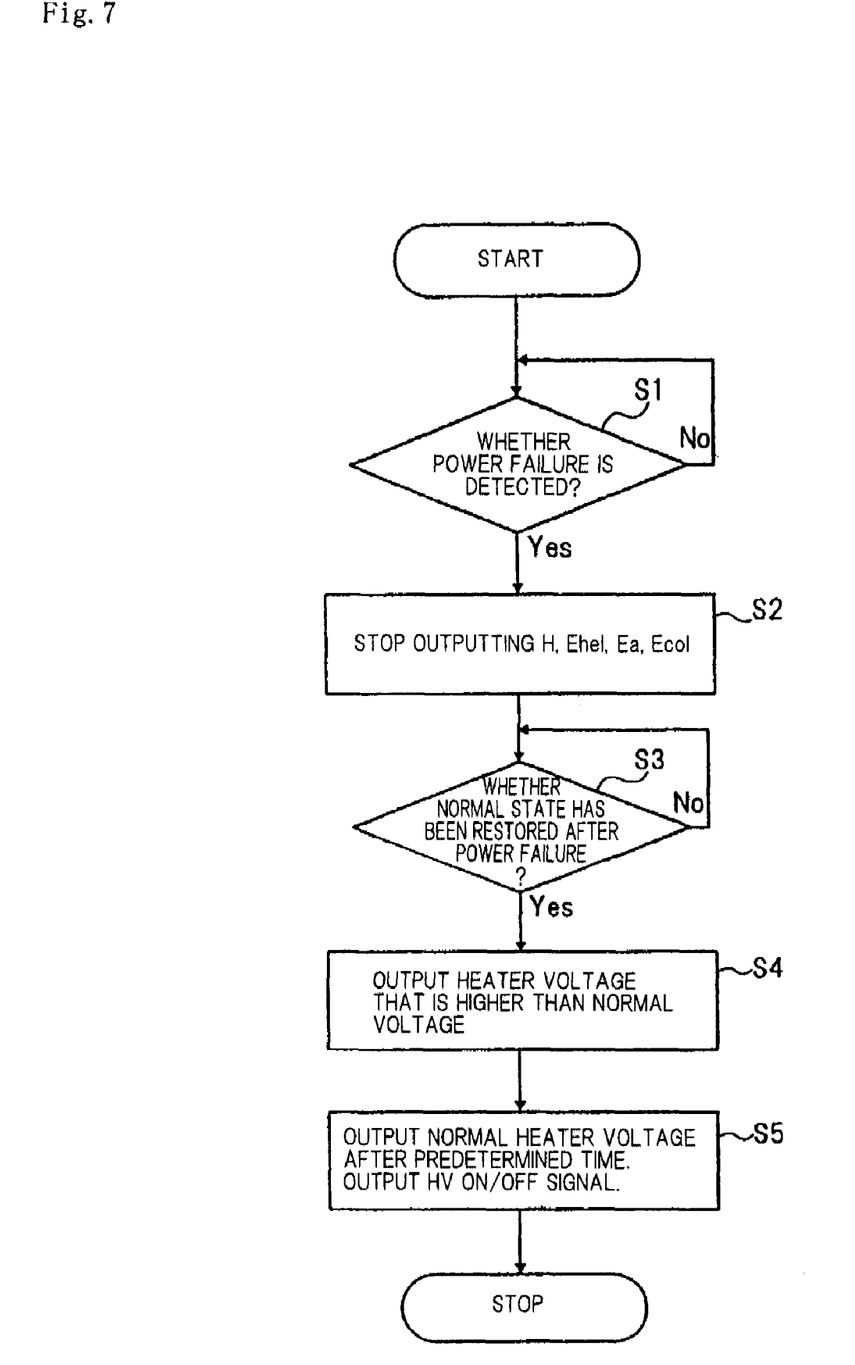
FIG. 7 is a flowchart showing the operation during restoration of the power supply after a power failure of the power supply unit shown in FIGS. 4 and 6.

FIG. 7 is a flow chart showing the operation for restoration of the power supply units shown in FIGS. 4 and 6.

As shown in FIG. 7, control circuit 140 observes the output signal from power failure detecting circuit 150 and checks whether the output signal from power failure detecting circuit 150 detects a power failure (Step S1). When the output signal from power failure detecting circuit 150 shows no detection of a power failure, the operation returns to Step S1 to continue observation of the output signal from power failure detecting circuit 150.

When the output signal from power failure detecting circuit 150 shows detection of a power failure, control circuit 140 stops outputting the first driving signal to driver circuit 112 to stop the output of heater voltage H. Also, control circuit 140 stops outputting an HV ON/OFF signal to stop the output of helix voltage EheI, anode voltage Ea and collector voltage EcoI from a high-voltage power supply circuit, not illustrated, (Step S2). At the same time control circuit 140 causes timer circuit 120 to measure the duration of the power failure.

Control circuit 140 again observes the output signal from power failure detecting circuit 150 to check whether the output signal from power failure detecting circuit 150 shows detection of a power failure (whether the normal state has been restored from the power failure) (Step S3). When the output signal from power failure detecting circuit 150 shows detection of a power failure (during power failure), the operation returns to Step S3 and continues observation of the output signal from power failure detecting circuit 150.

When the output signal from power failure detecting circuit 150 shows no detection of a power failure (restoration from the power failure), control circuit 140 outputs the second driving signal to driver circuit 112 to let it output heater voltage H that is higher than the normal voltage if the power supply circuit has the configuration shown in FIG. 4. On the other hand, when control circuit 140 has the configuration shown in FIG. 6, control circuit 140 outputs the second driving signal to transistor Q3 of regulator circuit 160 to let it output heater voltage H that is higher than the normal voltage (Step S4). In this process, the output period of the second driving signal may coincide with the duration of the power failure that was measured by timer circuit 120.

Since the output period of the second driving signal has lapsed, control circuit 140, when the power supply circuit has the configuration shown in FIG. 4, outputs the first driving signal to driver circuit 112 to let it output the normal voltage and also outputs an HV ON/OFF signal so as to cause a high-voltage power supply circuit, not illustrated, to output helix voltage EheI, anode voltage Ea and collector voltage EcoI to restart the operation of traveling-wave tube 1.

On the other hand, when the power supply circuit has the configuration shown in FIG. 6, control circuit 140 outputs the first driving signal to transistor Q3 of regulator circuit 160 so as to output the normal voltage and also outputs an HV ON/OFF signal so as to cause a high-voltage power supply circuit, not illustrated, to output helix voltage EheI, anode voltage Ea and collector voltage EcoI to restart the operation of traveling-wave tube 1 (Step S5).

According to the power supply unit of the present exemplary embodiment, if a power failure of DC voltage source 11 occurs in the normal operation mode of traveling-wave tube 1, it is possible to raise the temperature of cathode electrode 11 of traveling-wave tube 1 faster than the background art does by supplying a voltage higher than the normal voltage to heater 12 at the time that the power supply is restored after a power failure.

Accordingly, it is possible to make cathode electrode 11 reach the operable temperature of traveling-wave tube 1 in a shorter time. In particular, when the preheating time is set equal to the power failure time and the power failure time is short, then preheating time is short, and it is possible to make cathode electrode 11 reach the operable temperature of traveling-wave tube 1.

As a result, it is possible to shorten the preheating time for restoring the power supply after power failure and make the traveling-wave tube 1's operation after restoration stable. In particular, the power supply unit of the exemplary embodiment is effectively applied to an event of a so called instantaneous power failure in which the duration of the power failure is short and in which the temperature of cathode electrode 11 is high compared with the state in which cathode electrode 11 is totally cooled condition when, for example, the power supply unit is activated.

The Second Exemplary Embodiment

Figure 8:
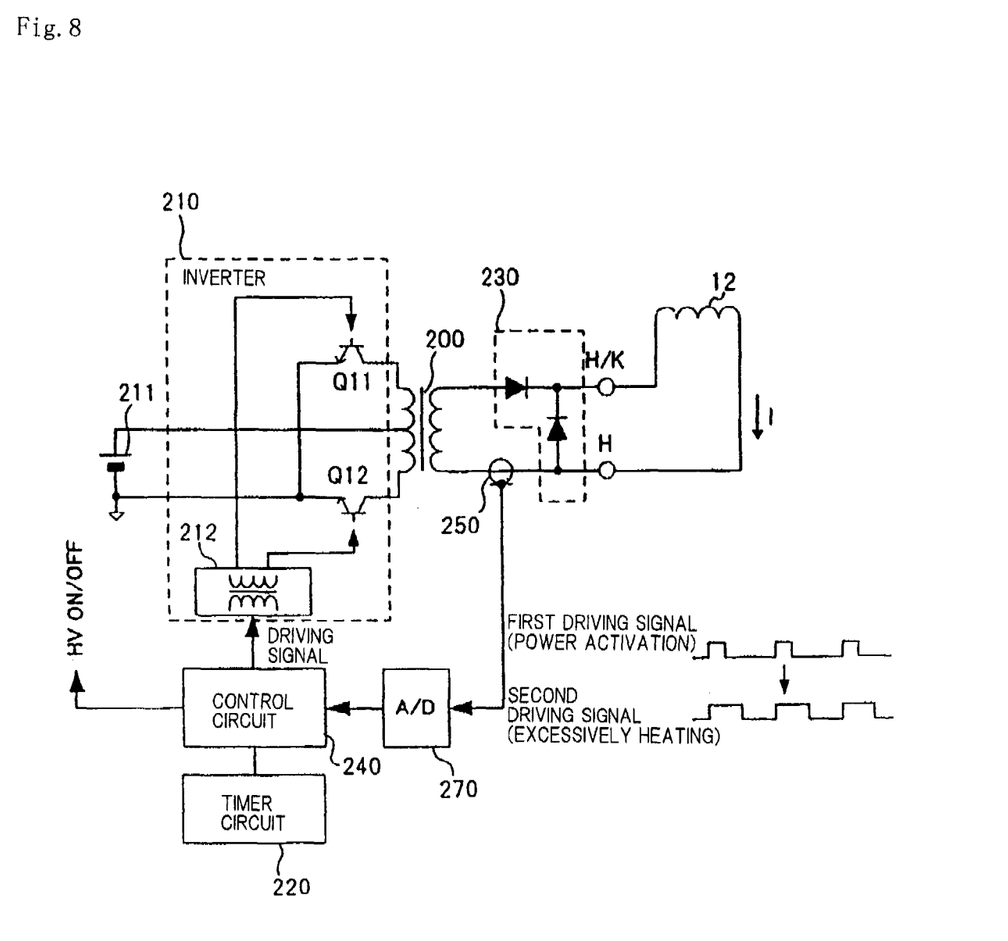
FIG. 8 is a circuit diagram showing a configuration of the second exemplary embodiment of a power supply unit of the present invention.
Figure 9:
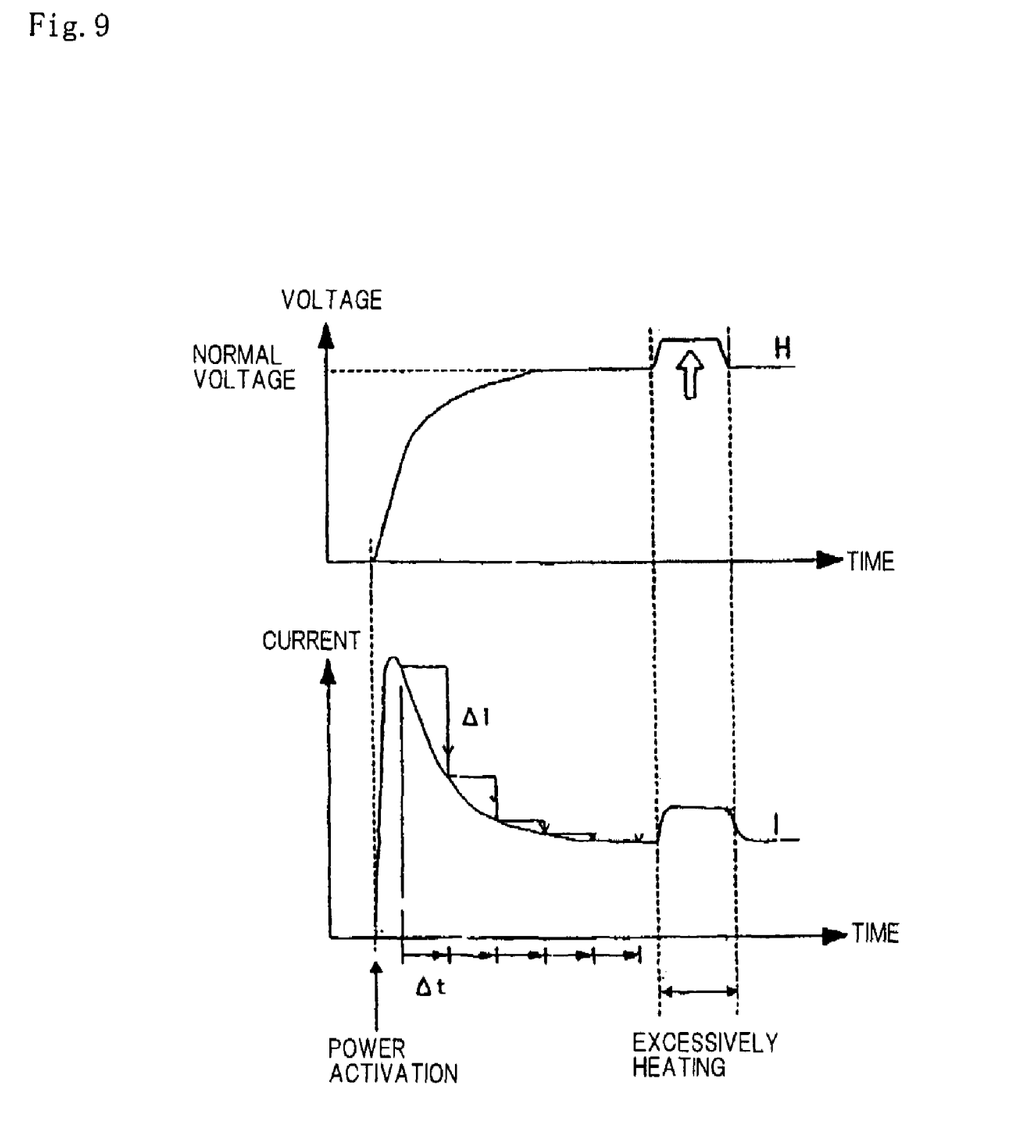
FIG. 9 is a waveform chart showing a voltage waveform and current waveform output from the heater power supply circuit shown in FIG. 8.

FIG. 8 is a circuit diagram showing a configuration of the second exemplary embodiment of a power supply unit of the present invention. FIG. 9 is a waveform chart showing a voltage waveform and current waveform output from the heater power supply circuit shown in FIG. 8. Here, the power supply unit shown in FIG. 8 only includes a configuration of a heater power supply circuit for generating heater voltage H, but the power supply unit may include high-voltage power supply circuits for generating helix voltage EheI, anode voltage Ea and collector voltage EcoI. Heater voltage H and heater current I shown in FIG. 9 are shown by schematically illustrating how the voltage and current behave without specifying exact measurements.

As shown in FIG. 8, the power supply unit of the second exemplary embodiment includes transformer 200, DC voltage source 211, inverter 210 for converting the DC voltage output from DC voltage source 211 into an AC voltage to be supplied to the primary coil of transformer 200, timer circuit 220, rectifying circuit 230 for rectifying the AC voltage output from the secondary coil of transformer 200 and supplying it to heater 12, control circuit 240 that controls the operation of inverter 210 and outputs an HV ON/OFF signal as a control signal for enabling the output of helix voltage EheI, anode voltage Ea and collector voltage EcoI, current detector 250 for detecting the current (heater current I) flowing through heater 12 and A/D converter 270 for A/D converting heater current I detected by current detector 250 and supplying the result to control circuit 240.

Inverter 210 includes transistors Q11 and Q12 for converting the DC voltage output from DC voltage source 211 into an AC voltage and driver circuit 212 for alternately turning on and off transistors Q11 and Q12.

Rectifying circuit 230 includes a full-wave rectifying circuit made of two diodes, for example and rectifies the AC voltage output from the secondary coil of transformer 200 to output as heater voltage H a negative DC voltage based on the H/K potential of cathode electrode 11.

Current detector 250 is connected to secondary transformer 200 to detect the current flowing through heater 12. The measurement detected by current detector 250 is converted into a digital signal by A/D converter 270 to be supplied to control circuit 240.

Control circuit 240 can be embodied by an LSI including logical circuits and memory or a processor (computer) including a CPU and a recording medium having a program for realizing the process to be executed by the CPU. When the control circuit is embodied in a processor, the function of control circuit 240 described hereinbelow can be realized by a CPU that executes the process in accordance with the program stored in the recording medium.

Though FIG. 8 shows a configuration in which timer circuit 220 is provided independently, the timer circuit is not needed if control circuit 240 has a timer function. Also, FIG. 8 shows a configurational example in which the output signal from current detector 250 is converted by using A/D converter 270 into a digital signal, which is supplied to control circuit 240. However, if control circuit 240 can directly process the output signal (analog signal) from current detector 250, A/D converter 270 is not needed.

When the power supply unit of the second exemplary embodiment is activated, the heater voltage is boosted using a predetermined time constant and then is controlled to be kept at a predetermined fixed level (normal voltage) as shown in FIG. 9. Since heater 12 has a characteristic in which its resistance becomes greater as the temperature increases, the current passing through heater 12 takes a maximum value immediately after power activation, and then the current gradually decreases as the resistance increases.

Further, in the power supply unit of the second exemplary embodiment, the rate of change (DI) of heater current I detected by current detector 250 is calculated for every predetermined unit time (Dt) by the process of control circuit 240 so that the control circuit determines that heater 12 has reached the designated temperature when the rate of change becomes equal to or lower than a predetermined threshold and outputs HV ON/OFF signal. Here, in the present exemplary embodiment, it is also possible to control the system by setting heater voltage H at a slightly higher level than the normal voltage for a predetermined fixed period to increase the current flowing through heater 12 when the rate of change of current I flowing through heater 12 has fallen within the predetermined threshold range, then returning heater voltage H to the normal voltage and outputting HV ON/OFF signal at the same time. The heater voltage H that is set higher than the normal voltage and its application time should be set appropriately so that the stress given to the heater or the cathode electrode will not shorten the life of the heater or degrade the performance of the cathode electrode.

In the power supply unit of the second exemplary embodiment, it is determined whether heater 12 reaches the designated temperature by detecting the rate of change of the current flowing through heater 12. Accordingly, it is possible to start the operation of traveling-wave tube 1 by outputting an HV ON/OFF signal when the rate of change of the current flowing through the heater falls within the predetermined threshold range, without the need to wait for a lapse of the predetermined preheating time using a timer circuit as in the power supply unit of the background art.

However, there may be a case where cathode electrode 11 has not reached a state of thermal equilibrium despite the fact that the rate of change of the current flowing through the heat has become small as described above. To deal with this, in the present exemplary embodiment, heater voltage H is slightly increased to let current I flowing through heater 12 be greater for a predetermined fixed period when the rate of change of heater current I falls within the predetermined threshold range. In this way it is possible to shorten the time for cathode electrode 11 to reach a state of thermal equilibrium by excessively heating cathode electrode 11, so that traveling-wave tube 1 can operate stably if helix voltage EheI, anode voltage Ea and collector voltage EcoI are supplied. When traveling-wave tube 1 is small, and when there are a few parts arranged near the cathode electrode and in other cases where cathode electrode 11 is assumed to have fully reached a state of thermal equilibrium when the rate of change of the current flowing through the heater falls within the predetermined threshold range, operation of traveling-wave tube 1 may be started by outputting an HV ON/OFF signal from control circuit 240 without performing excessive heating.

Heater voltage H can be controlled by switching the pulse width of the driving signal to be supplied from control circuit 240 to driver circuit 212 as shown in FIG. 8. Specifically, at the time that power is activated, a first driving signal having a relatively narrow pulse width is supplied to transistors Q11 and Q12 from control circuit 240 by way of drive circuit 212. When cathode electrode 11 is heated to excess, a second driving signal having a pulse width wider than that of the normal operation is supplied to transistors Q11 and Q12 from control circuit 240 by way of drive circuit 212. In this case, heater voltage H takes a value proportional to the pulse width while transistors Q11 and Q12 are on. That is, heater voltage H driven by the second driving signal is higher than heater voltage H driven by the first driving signal.

Figure 10:
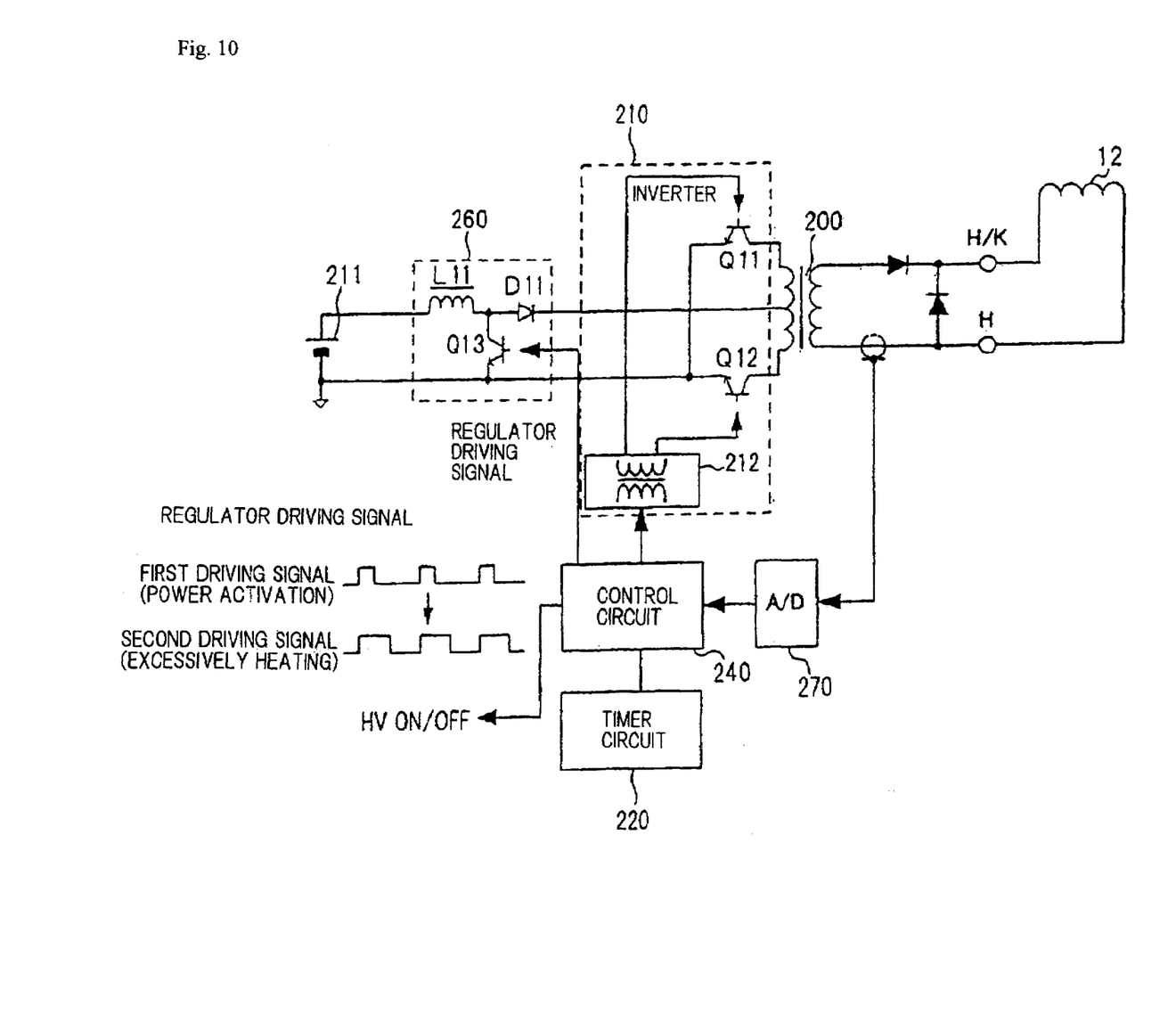
FIG. 10 is a circuit diagram showing another configurational example of the second exemplary embodiment of a power supply unit of the present invention.

Alternatively, heater voltage H may be controlled by providing regulator circuit 260 between DC voltage source 211 and the primary coil of transformer 200 and by supplying a regulator driving signal from control circuit 240 to regulator circuit 260, as shown in FIG. 10.

Regulator circuit 260 shown in FIG. 10 is a boost type circuit for boosting the DC voltage output from DC voltage source 211, and includes inductance L11 and diode D11 which are connected in series between the output terminal of DC voltage source 211 and the center tap of the primary coil of transformer 200 and includes a transistor Q13 connected in parallel with DC voltage source 211. In regulator circuit 260 shown in FIG. 10, energy is accumulated in inductance L11 while transistor Q13 is on, whereas the energy accumulated in inductance L11 is supplied to inverter 210 via diode D11 while transistor Q13 is off. In this configuration, the boosted voltage can be controlled by the pulse width of the driving signal supplied to the base of transistor Q13, hence it is possible to supply a boosted voltage proportional to the pulse width to inverter 210.

When regulator circuit 260 shown in FIG. 10 is arranged between DC voltage source 211 and the primary coil of transformer 200, at the time that power is activated the first driving signal having a relatively narrow pulse width is supplied from control circuit 240 to transistor Q13 of regulator circuit 260. On the other hand, at the time of excessively heating cathode electrode 11, the second driving signal having a pulse width wider than that in the normal operation mode is supplied from control circuit 240 to transistor Q13 of regulator circuit 260. In this case, heater voltage H takes a value proportional to the pulse width while transistor Q13 is on. That is, heater voltage H driven by the second driving signal is higher than heater voltage H driven by the first driving signal.

When heater voltage H is controlled by use of regulator circuit 260 shown in FIG. 10, a driving signal having a fixed pulse width may and should be supplied to inverter 210. Here, the driving signal supplied to regulator circuit 260 and the driving signal supplied to inverter 210 may or may not be synchronized with each other. However, if the driving signal supplied to regulator circuit 260 is synchronized with the driving signal supplied to inverter 210, the frequency components of the driving signal leaking toward the secondary coil of transformer 200 decrease, so that noise components contained in heater voltage H can be reduced.

Here, as regulator circuit 260, a well-known buck-boost type circuit may also be used to perform control instead of the boost type circuit shown in FIG. 10. When a buck-boost type circuit is used, at the time that power is activated a driving signal having a relatively wide pulse width is supplied from control circuit 240 to regulator circuit 260, whereas while cathode electrode 11 is heated excessively, a driving signal having a pulse width narrower than that at the normal operation is supplied from control circuit 240 to regulator circuit 260, whereby it is possible to set heater voltage H to be higher than the normal voltage.

Regulator circuit 260 may be used any type of well-known circuits if the pulse width of the driving signal supplied from control circuit 240 is set up appropriately in accordance with the input/output characteristics.

Next, the processing sequence of the control circuits shown in FIGS. 8 and 10 at the time power is activated will be described with reference to FIG. 11.

Figure 11:
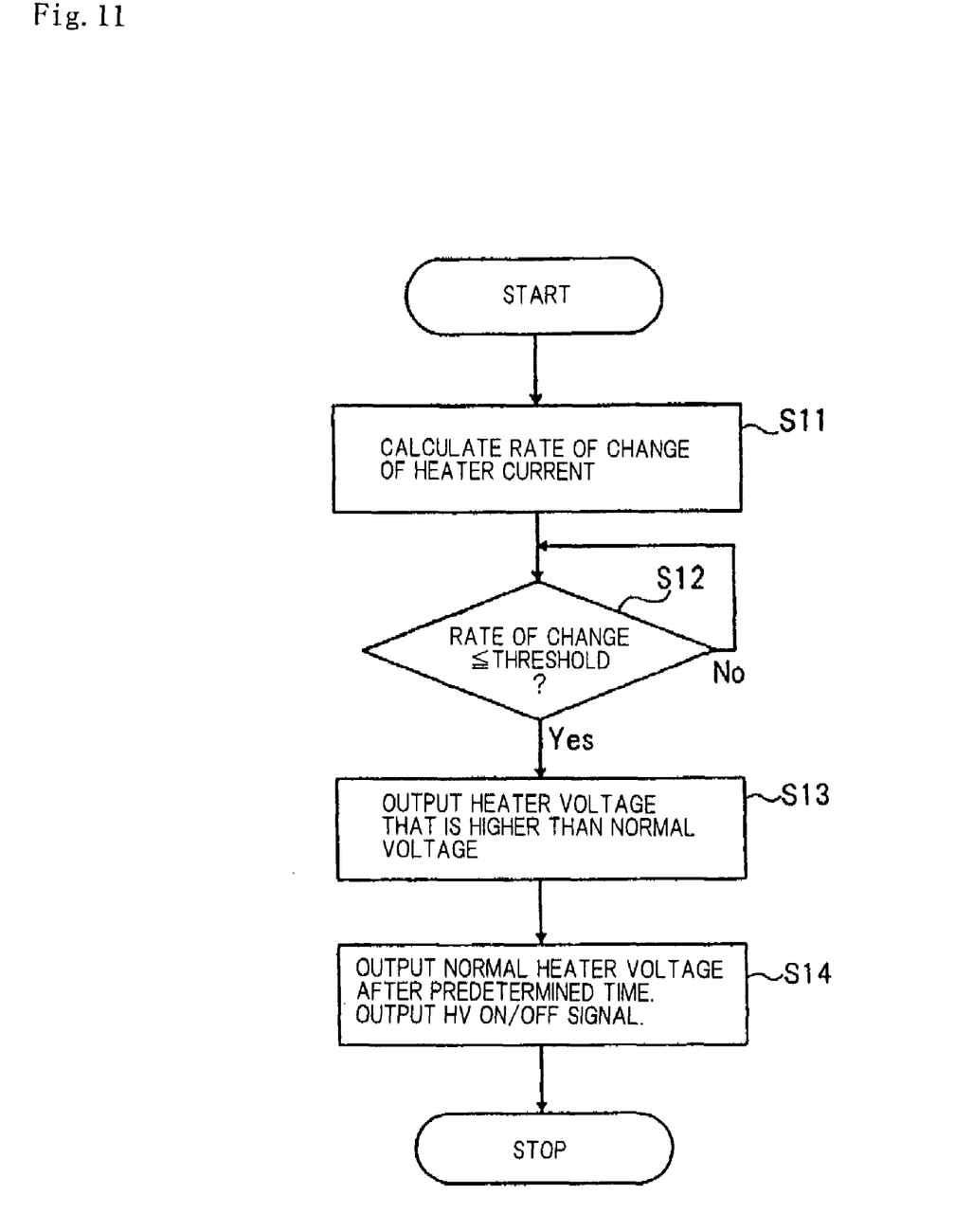
FIG. 11 is a flowchart showing the operation when the power supply unit shown in FIGS. 8 and 10 is activated.

FIG. 11 is a flow chart showing the operation of the power supply units shown in FIGS. 8 and 10 at the time that power is activated.

As shown in FIG. 11, control circuit 240 outputs the first driving signal to driver circuit 212 at the time that power is activated to let it output the heater voltage. Also, the control circuit observes the current detected value supplied from A/D converter 270 and calculates the rate of change of heater current I per predetermined unit time (Step S11).

Next, control circuit 240 compares the calculated rate of change of heater current I with a predetermined threshold, and determines whether the rate of change of heater current I is equal to or smaller than the threshold (Step S12). When the rate of change of heater current I is greater than the threshold, the operation returns to Step S1, to continue calculation of the rate of change of heater current I.

When the rate of change of heater current I is equal to or lower than the threshold, control circuit 240 outputs the second driving signal to driver circuit 212 to let it output heater voltage H that is higher than the normal voltage if the power supply circuit has the configuration shown in FIG. 8. On the other hand, when control circuit 240 has the configuration shown in FIG. 10, the control circuit outputs the second driving signal to transistor Q13 of regulator circuit 260 to let it output heater voltage H that is higher than the normal voltage (Step S13). In this process, control circuit 240 outputs the second driving signal to driver circuit 212 for a predetermined fixed period, using timer circuit 220.

Since the output period of the second driving signal has lapsed, control circuit 240, when the power supply circuit has the configuration shown in FIG. 8, outputs the first driving signal to driver circuit 212 to let it output the normal voltage and also outputs an HV ON/OFF signal so as to cause a high-voltage power supply circuit, not illustrated, to output helix voltage EheI, anode voltage Ea and collector voltage EcoI to start the operation of traveling-wave tube 1. On the other hand, when the power supply circuit has the configuration shown in FIG. 10, control circuit 240 outputs the first driving signal to transistor Q13 of regulator circuit 260 so as to output the normal voltage and also outputs an HV ON/OFF signal so as to cause a high-voltage power supply circuit, not illustrated, to output helix voltage EheI, anode voltage Ea and collector voltage EcoI to restart the operation of traveling-wave tube 1 (Step S14).

According to the power supply unit of the present exemplary embodiment, if the rate of change of heater current I is equal to or lower than the predetermined threshold at the time that power is activated, it can be determined that heater 12 has reached the designated temperature. Accordingly, the control signal for starting the operation of traveling-wave tube 1 is output at this stage, so that it is possible to shorten the preheating time at the time that power is activated compared to the background art. Further, when a voltage higher than the normal voltage is supplied at the moment that the rate of change of heater current I becomes equal to or lower than the threshold so as to excessively heat cathode electrode 11, the transfer of cathode electrode 1 to the state of thermal equilibrium can be promoted. Accordingly, it is possible to make traveling-wave tube 1 operate in a stable manner.

Here, in the power supply unit of the second exemplary embodiment, since the current flowing through the secondary coil of transformer 200 is detected by current detector 250, it is hence possible to detect the occurrence of a power failure at DC voltage source 211 and restoration of the power supply after a power failure based on the presence of the current.

Accordingly, the power supply unit of the second exemplary embodiment can also execute the same process as in the first exemplary embodiment at the time of restoration of the power supply after a power failure by rewriting the program of control circuit 240.

In this case, in the process at Step S1 shown in FIG. 7 control circuit 240 is adapted to observe the current flowing through the secondary coil of transformer 200 by use of current detector 250. When a current is flowing through the secondary coil of transformer 200 the control circuit determines that no power failure is occurring, returns to the process at Step S1 shown in FIG. 7 and continues observation of the presence of the current by current detector 250. When no current is flowing through the secondary coil of transformer 200 the control circuit determines that a power failure has occurred. In the process at Step S2 shown in FIG. 7, the control circuit stops outputting the first driving signal to driver circuit 212 so as to stop output of heater voltage H and stops outputting an HV ON/OFF signal so as to stop output of helix voltage Ehel, anode voltage Ea and collector voltage Ecol. Then in the process at Step S3 shown in FIG. 7, when a current flowing through the secondary coil of transformer 200 has been detected by means of current detector 250 (restoration from a power failure), the control circuit causes heater voltage H that is higher than that in the normal operation to output at Step S4 in the same manner as in the first exemplary embodiment, and then causes heater voltage H in the normal operation mode to output after a lapse of the predetermined period at Step S5 while outputting an HV ON/OFF signal so as to supply helix voltage Ehel, anode voltage Ea and collector voltage Eco to traveling-wave tube 1.

Here, the power supply unit of the second exemplary embodiment shown in FIG. 8 or FIG. 10 may be provided with power failure detecting circuit 150 so that power failure detecting circuit 150 may detect a power failure that occurs in DC voltage source 211 and restoration of the power supply after a power failure, in the same manner as in the first exemplary embodiment.

Execution of this process makes it possible to shorten the preheating time of the heater provided for traveling-wave tube 1, both at the time of power activation and at the time of restoration of the power supply after a power failure.

Further, the power supply unit of the second exemplary embodiment may be constructed so as to output heater voltage H that is higher than that in the normal operation mode at the time of restoration of the power supply after a power failure in the same manner as in the first exemplary embodiment while calculating the rate of change of heater current I flowing through the secondary coil of transformer 200 similarly to the time of power activation. When the rate of change of heater current I falls equal to or lower than the predetermined threshold, the operation of traveling-wave tube 1 may be started by returning heater voltage H to the normal voltage and outputting an HV ON/OFF signal. This technique for determining the starting timing of operating traveling-wave tube 1 based on the rate of change of heater current I will not depend on the thermal structure system made up of cathode electrode 11 and associated parts arranged close to it and this technique can determine the start time of operating traveling-wave tube 1 at the time that power is activated or at the time that the power supply unit is restored after a power failure. Accordingly, the power supply unit of the present exemplary embodiment is not only used to supply various power supply voltages to an electron tube whose thermal structure around the cathode electrode is known but is also used to supply various power voltages to a variety of electron tubes whose thermal structure around the cathode electrode is unknown as long as the power supply unit is used within the rated capacity. That is, the power supply unit is highly versatile.

While the invention has been particularly shown and described with reference to exemplary embodiments thereof, the invention is not limited to these embodiments. It will be understood by those ordinarily skilled in the art that various changes in form and details may be made therein without departing from the spirit and scope of the present invention as defined by the claims.

What is claimed is:

1. A power supply unit for supplying a normal voltage that is a fixed voltage to a heater of an electron tube while the electron tube operates in normal mode, comprising:
    a DC voltage source;
    an inverter for converting a DC voltage output from said DC voltage source into an AC voltage;
    a rectifying circuit for rectifying said AC voltage to supply a DC voltage to said heater;
    a power failure detecting circuit for detecting occurrence of a power failure in said DC voltage source and restoration of the power supply after a power failure; and
    a control circuit which, when occurrence of a power failure in said DC voltage source in the normal operation mode of said electron tube and restoration of the power supply after a power failure is detected by said power failure detecting circuit, causes said rectifying circuit to supply a voltage higher than said normal voltage to said heater, causes said rectifying circuit to supply said normal voltage to said heater and outputs a control signal to start the operation of said electron tube after a lapse of a predetermined time.

2. The power supply unit according to claim 1, wherein said inverter comprises:
    two transistors for converting the DC voltage output from said DC voltage source into an AC voltage; and
    a driver circuit for alternately turning on and off said transistors, wherein said control circuit controls the voltage to be supplied to said heater based on the width of a pulse to be supplied to said transistors by way of said driver circuit.

3. The power supply unit according to claim 1, further comprising a regulator circuit including a transistor connected in parallel with said DC voltage source, connected between said DC voltage source and said inverter, wherein said control circuit controls the voltage to be supplied to said heater based on the width of a pulse supplied to the transistor provided in said regulator circuit.

4. A high-frequency circuit system comprising:
    an electron tube; and
    a power supply unit according to claim 1 for supplying said heater voltage to said electron tube.

5. A power supply unit for supplying power to a heater provided for an electron tube, comprising:
    a DC voltage source;
    an inverter for converting a DC voltage output from said DC voltage source into an AC voltage;
    a rectifying circuit for rectifying said AC voltage to supply the resultant DC voltage to said heater;
    a current detector for detecting the heater current flowing through said heater; and
    a control circuit which, at the time of power activation, determines the rate of change of the current flowing through said heater, said current being detected by said current detector for every predetermined period time, and outputs a control signal that starts the operation of said electron tube when said rate of change becomes equal to or lower than a predetermined threshold.

6. The power supply unit according to claim 5, wherein when said rate of change becomes equal to or lower than the predetermined threshold, said control circuit causes said rectifying circuit to supply said heater with a voltage higher than a normal voltage that is a fixed voltage to be supplied to said heater of said electron tube in the normal operation mode, and causes said rectifying circuit to supply said normal voltage to said heater and outputs a control signal to start the operation of said electron tube after a lapse of a predetermined time.

7. The power supply unit according to claim 5, wherein when the occurrence of a power failure in said DC voltage source and restoration of the power supply after a power failure have been detected based on the presence of the heater current detected by said current detector, said control circuit causes said rectifying circuit to supply said heater with a voltage higher than a normal voltage that is a fixed voltage to be supplied to said heater of said electron tube in the normal operation mode, and causes said rectifying circuit to supply said normal voltage to said heater and outputs a control signal to start the operation of said electron tube when said rate of change falls equal to or lower than a predetermined threshold.

8. The power supply unit according to claim 5, wherein said inverter comprises:
two transistors for converting the DC voltage output from said DC voltage source into an AC voltage; and
a driver circuit for alternately turning on and off said transistors, wherein said control circuit controls the voltage to be supplied to said heater based on the width of a pulse supplied to said transistors by way of said driver circuit.

9. The power supply unit according to claim 5, further comprising a regulator circuit including a transistor connected in parallel with said DC voltage source, connected between said DC voltage source and said inverter, wherein said control circuit controls the voltage to be supplied to said heater based on the width of a pulse supplied to the transistor provided in said regulator circuit.

10. A high-frequency circuit system comprising:
an electron tube; and
a power supply unit according to claim 5 for supplying said heater voltage to said electron tube.

11. A heater voltage control method for use in a power supply unit for supplying a normal voltage that is a fixed voltage to a heater of an electron tube while the electron tube operates in normal mode, comprising: a DC voltage source; an inverter for converting a DC voltage output from said DC voltage source into an AC voltage; and a rectifying circuit for rectifying said AC voltage to supply a DC voltage to said heater, comprising the steps of:
supplying said heater with a voltage higher than said normal voltage from said rectifying circuit when occurrence of a power failure in said DC voltage source in the normal operation mode of said electron tube and restoration of the power supply after a power failure is detected; and
supplying said normal voltage from said rectifying circuit to said heater and outputting a control signal for starting the operation of said electron tube after a lapse of a predetermined time.

12. A heater voltage control method for controlling a voltage to be supplied to a heater provided for an electron tube from a power supply unit comprising: a DC voltage source; an inverter for converting a DC voltage output from said DC voltage source into an AC voltage; a rectifying circuit for rectifying said AC voltage to supply the resultant DC voltage to said heater; a current detector for detecting the heater current flowing through said heater, comprising the steps of:
determining the rate of change of said heater current detected at the time of power activation by said current detector, for every predetermined period of time; and
outputting a control signal for starting the operation of said electron tube when said rate of change falls equal to or lower than a predetermined threshold.

13. The heater voltage control method according to claim 12 further comprising the steps of:
supplying said heater with a voltage higher than the normal voltage that is a fixed voltage to be supplied to said heater of said electron tube in the normal operation mode when said rate of change becomes equal to or lower than the predetermined threshold; and
supplying said heater with said normal voltage from said rectifying circuit and outputting a control signal to start the operation of said electron tube after a lapse of a predetermined time.

14. The heater voltage control method according to claim 12 further comprising the steps of:
supplying said heater with a voltage higher than the normal voltage that is a fixed voltage to be supplied to said heater of said electron tube in normal operation mode when occurrence of a power failure in said DC voltage source and restoration of the power supply after a power failure have been detected based on the presence of the heater current detected by said current detector; and
causing said rectifying circuit to supply said normal voltage to said heater and outputting a control signal to start the operation of said electron tube when said rate of change becomes equal to or lower than the predetermined threshold.

\* \* \* \* \*